United States Patent
Mao et al.

(10) Patent No.: US 8,283,920 B2
(45) Date of Patent: Oct. 9, 2012

(54) THIN FILM MAGNETIC FIELD SENSOR

(75) Inventors: Xinhui Mao, Shanghai (CN); HuanBin Fang, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 1050 days.

(21) Appl. No.: 12/171,211

(22) Filed: Jul. 10, 2008

(65) Prior Publication Data
US 2010/0007343 A1    Jan. 14, 2010

(51) Int. Cl.
G01R 33/02    (2006.01)
G01R 33/09    (2006.01)

(52) U.S. Cl. ........................................ 324/249; 324/252

(58) Field of Classification Search .................. 324/249, 324/252
See application file for complete search history.

(56) References Cited

U.S. PATENT DOCUMENTS

| | | | |
|---|---|---|---|
| 5,982,171 A * | 11/1999 | Umemoto et al. | 324/207.21 |
| 6,177,870 B1 | 1/2001 | Lian et al. | |
| 6,229,307 B1 | 5/2001 | Umehara et al. | |
| 6,566,872 B1 | 5/2003 | Sugitani | |
| 2001/0045827 A1 * | 11/2001 | Shinjo et al. | 324/207.21 |
| 2002/0153881 A1 * | 10/2002 | Taguchi et al. | 324/207.21 |
| 2004/0150397 A1 | 8/2004 | Kuroe et al. | |
| 2008/0024118 A1 | 1/2008 | Kahlman et al. | |
| 2008/0052932 A1 | 3/2008 | Xue et al. | |
| 2008/0068007 A1 * | 3/2008 | Hoshiya et al. | 324/207.21 |

OTHER PUBLICATIONS

Maury et al., "Copper Precipitation in FeCu, FeCuMn, and FeCuNi Dilute Alloys Followed by X-ray Absorption Spectroscopy," J. Phys. Condens. Matter, vol. 6, pp. 569-588, 1994.

* cited by examiner

*Primary Examiner* — Bot Ledynh
(74) *Attorney, Agent, or Firm* — Seager Tufte & Wickhem LLC

(57) ABSTRACT

A magnetic field effect sensor system having giant magneto-impedance elements. The elements may be elongated strips, and in proximity to and parallel with one another, and connected in series with connections or electrodes. The elements may have a regular shape without turns. They may have a single- or multi-layer structure. Some of the layers in the elements may contain a soft magnetic material, for instance, which form a closed loop for magnetic flux around a non-magnetic conductor.

9 Claims, 3 Drawing Sheets

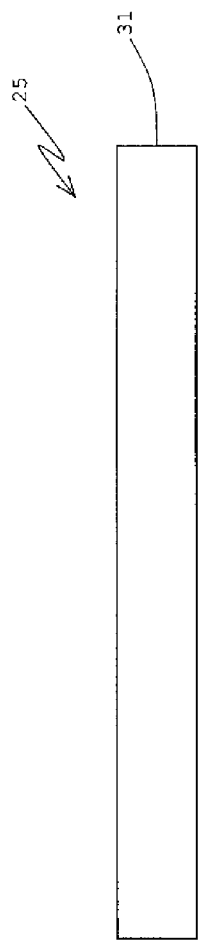
FIGURE 3
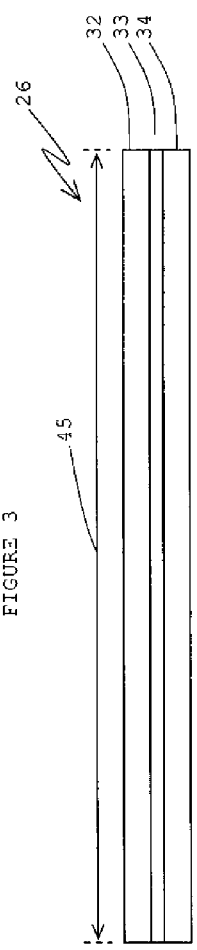
FIGURE 4a
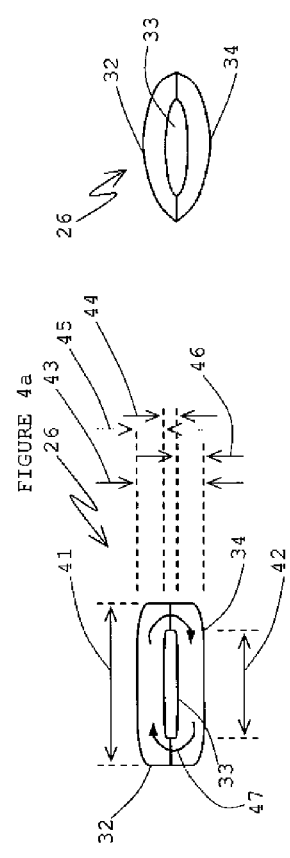
FIGURE 4b
FIGURE 4c
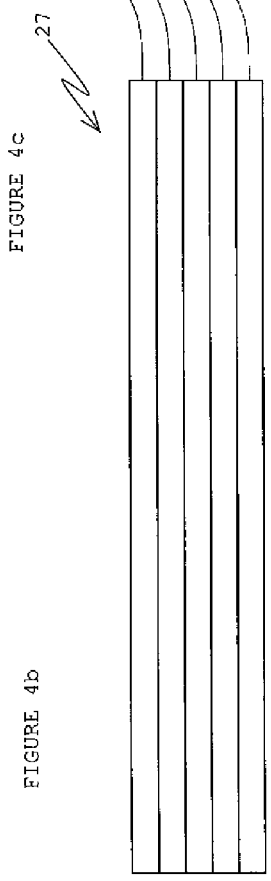
FIGURE 5

THIN FILM MAGNETIC FIELD SENSOR

BACKGROUND

The invention pertains to sensors and particularly to magnetic field sensors.

SUMMARY

The invention is a magnetic field sensor having two or more single- or multi-layer base elements having a regular shape, connected in series, situated parallel and proximate to each other, and incorporating giant magneto-impedance material.

BRIEF DESCRIPTION OF THE DRAWING

FIG. 3 is a diagram of a single layer element of the present sensor;

FIG. 4a is a diagram of a three layer element of the present sensor;

FIGS. 4b and 4c are diagrams of cross-sections of three layer elements for the present sensor; and FIG. 5 is a diagram of a five layer element of the present sensor.

DESCRIPTION

Giant magneto-impedance (GMI) effect means that the impedance of some kinds of materials can be changed dramatically when an external magnetic field is applied to them. These materials may be used to manufacture highly sensitive magnetic field sensors. Due to high sensitivity and potentially low cost, they may have wide application in use.

Figure 2:
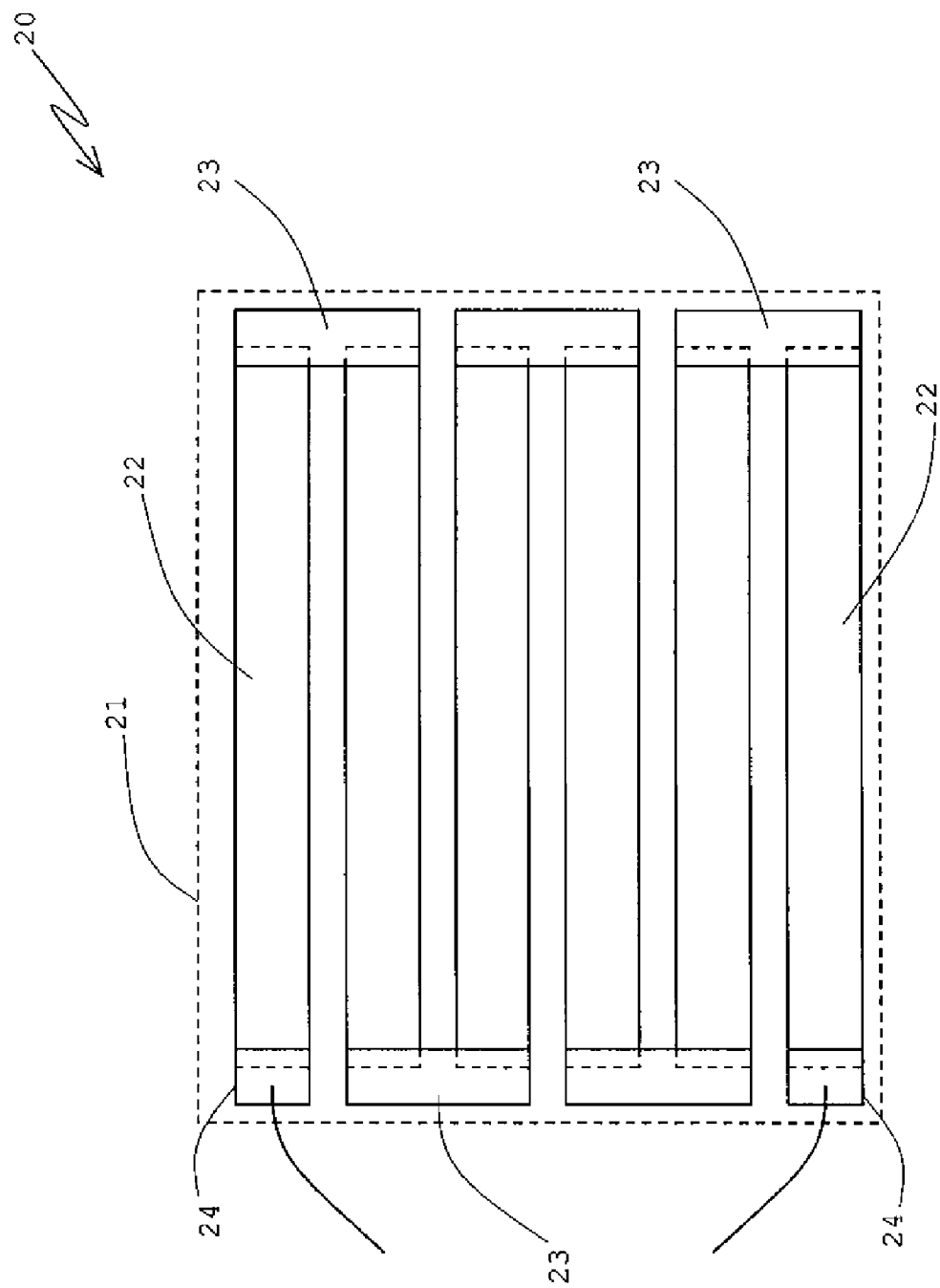
FIG. 2 is a diagram of the present giant magneto-impedance sensor layout.

To be compatible with an application-specific integrated circuit (ASIC), the GMI effect in thin films has been notable. To increase the resistance to meet the requirements of a drive/test circuit and decrease the total area of a thin film sensor, thin film GMI sensors may often be made with a layout of a serpentine, meandrous, circuitous or sinuous shape. In a GMI sensor, the magnetic flux may be concentrated by parallel GMI thin film lines, which can increase the sensitivity of the sensors, especially the ones in the middle. Also, when the distance between film lines is reduced, the effect of internal de-magnetic field may be reduced, which could increase the GMI ratio of the material. The present invention may include a new layout for the sensor or sensors, which can have features to further improve the performance of the overall thin film GMI sensor. Item 22 may be referred to as a sensor, film line, strip, straight strip, base element, or element (FIG. 2). The terms may be used interchangeably. "Element" may be the term generally used herein. Item 23 may be referred to as a connection, connector or an electrode that electrically connects the elements 22 to each other. Electrodes or terminals 24 may be added for externally connecting sensor 20 to another device. The layout 21 with the elements 22 and connections 23 may be regarded as a sensor 20.

Figure 1:
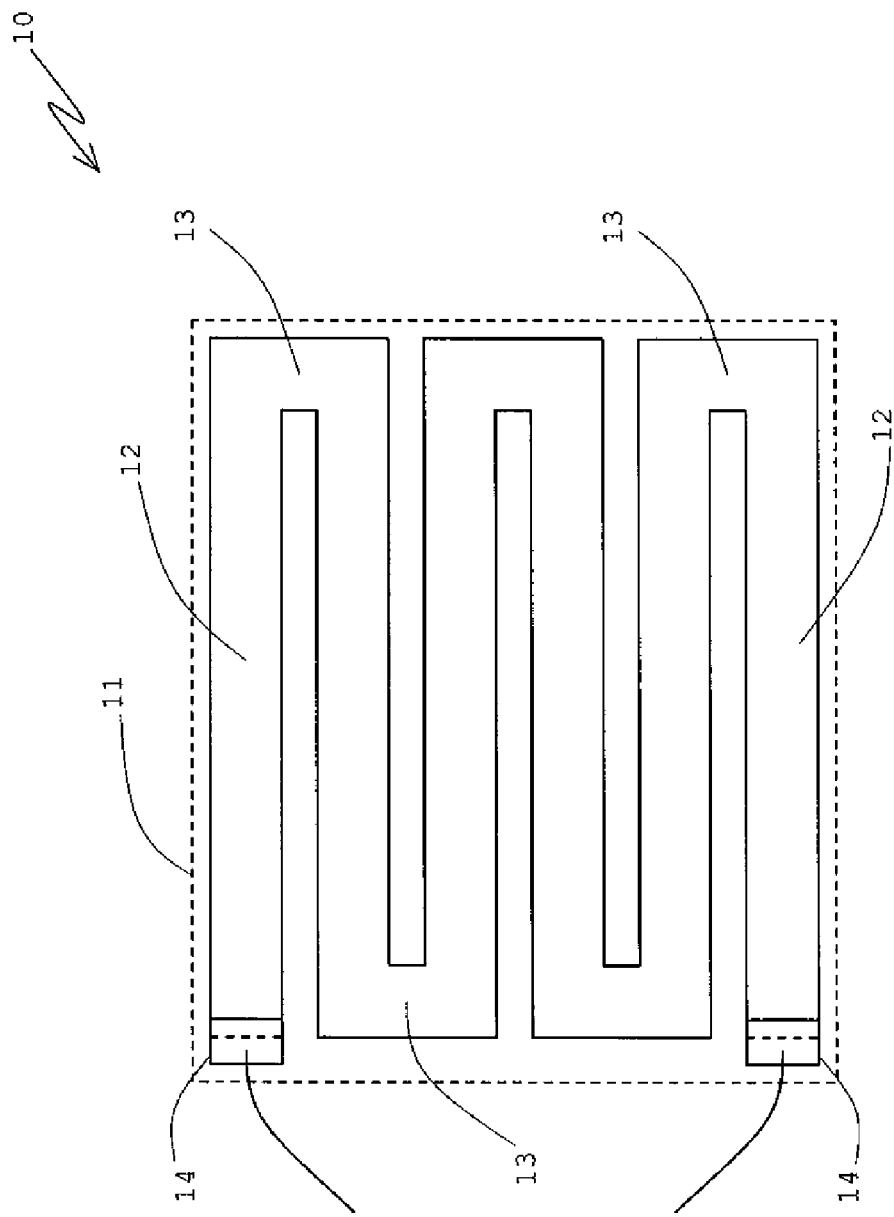
FIG. 1 is a diagram of a previous giant magneto-impedance sensor layout.

A diagram of a sensing element layout 11 of a previous GMI sensor 10 is shown in FIG. 1. A diagram of the sensing element layout 21 of the present GMI sensor 20 is shown in FIG. 2. The diagrams in FIGS. 1 and 2 are not necessarily drawn to scale. A GMI sensor needs ferromagnetic materials that have a well-defined magnetic anisotropy. In the previous layout 11, the bent or turned corners 13 of GMI film elements 12 would induce the dispersion of the directions of the magnetic anisotropy, which would decrease the GMI ratio significantly. The present layout 21 may eliminate this significant decrease of the GMI ratio by not having turned corners as a part of GMI film elements 22. Layout 21 may have straight strip type elements 22 that do not have the corner turns 13 of layout 11. Elements 22 may be situated on a substrate and connected in a series fashion with electrodes or connections 23. A connection 23 may be deposited on the ends of two strips or elements 22 thereby connecting the elements 22. Layout 21 with the electrodes or connections 23 does not necessarily require adding one or more additional steps to the fabrication process of a sensor having the previous layout 11, since the sensor 10 with layout 11 would need a deposition of electrodes 14 on at least two elements 12 for external connection.

In some types of GMI sensors, the ferromagnetic films with the turns may be too thick to be patterned appropriately and have effective sensing properties. Layout 21 may make the patterning easier since the thin film strips 22 need not be turned.

Layout 21 may be used in the products of thin film magnetic sensors 20. Both single-layer and multi-layer GMI sensors 20 may incorporate the layout 21 of the present approach.

As to the design of present sensor 20, except for the connection, a base element 22 of the sensor may be a thin film GMI material having a regular shape such as that of a rectangle. The element may have any regular shape. The element may be elongated and have a length to width ratio of about equal to or greater than two. Element 22 may have a single layer or multi-layer structure.

Sensor 20 having a layout 21 may be realistically modeled for simulating the GMI performance of the base element or elements 22 in the sensor. A resulting model of the sensor 20 having layout 21 may be made for a present sensing system design. If the base element or elements 22 of the GMI device do not have a regular shape, e.g., rectangle, then the relationship between driving current, intrinsic magnetic anisotropic and the external magnetic field may be too complicated for simulation. Thus, it would appear to be very difficult to develop a model for such a device. The ability to model the GMI sensor is a very important feature of the present layout 21 used in a design of a sensor 20 for real applications in that the models may be used in lieu of actual devices for verifying designs of the GMI sensor. In general, it is quite expensive to build actual devices for verifying designs of a sensor for particular applications. However, making a model of a GMI sensor 10 having a layout 11 where, for example, the base element or elements 12 of the GMI device do not have a regular shape, e.g., a rectangle, then the relationship between the driving current, intrinsic magnetic anisotropic and the external magnetic field may be too complicated for obtaining a useful and accurate simulation. Obtaining such simulation, if possible, would be unduly expensive to the extent that it may be more reasonable to use actual devices for verifying designs of the GMI sensor 10 having the layout 11. Thus, the present layout 21 makes it possible to reasonably model the GMI sensor 20 at a relatively low cost. Also, the modeling approach for sensor 20 consequently makes it far quicker to come up with tested designs without the slowness and expense of using actual devices for testing the designs.

Layout 21, for a given amount of space, provides a significantly larger effective sensing area than layout 11. Also, the larger area of the overlay of soft-magnetic film and non-magnetic film, without the corners 13 of layout 11, appears better for obtaining a good GMI effect from the sensor. In layout 11, common to other sensors such as sensor 10, the area of overlay at the corners 13 would result in little GMI effect due to problems of directions between the drive current and the material magnetic anisotropy. The design of sensor 20 permits the overlay 21 area to have effectively good GMI effect on an average per unit area. Thus, there appears to be no poor GMI effect in layout 21 of the overlay like that of the cornering or turns 13 of the element or elements 12 of layout 11.

Relative to fabrication of the sensor 20, the process of making connections 23 may be independent relative to the making of the GMI elements 22. For instance, connections 23 may be deposited before, during or after fabrication of the GMI sensor elements 22. There may be much freedom in the design and fabrication of sensor 20.

There may be various versions of sensor 20. The GMI elements 22 may have different kinds of layer designs. First, there may be a single layer version 25 as shown in FIG. 3. The diagram in FIG. 3 is not necessarily drawn to scale. A layer 31 of version 25 may include a soft magnetic material. Soft magnetic materials may include a Fe-based alloy, such as FeSiB, FeCuNiSiBCr, and the like; a Co-based alloy, such as CoSiB, CoFeSiB, CoZrNb, and the like; and permalloy and other materials with good soft magnetic properties. The film thickness of the single layer 31 may be several micrometers for obtaining a high GMI ratio.

Second, there may be a multilayer version 26 of element 22 as shown by a diagram in FIG. 4a. One configuration of the multilayer element version 26 may have a sandwich structure of three layers 32, 33 and 34, which may have a designation of F/C/F, where the F stands for a soft magnetic layer, as described herein, and the C stands for a nonmagnetic and conductive layer which may include, for example, Cu, Ag or Au. A requirement of the C layer is good conductivity and stability. The thickness of the multilayer element 22 may be less than that of the single-layer element 22.

Another version 27 of the multilayer element 22, as shown in FIG. 5, may have a sandwich structure of five layers 35, 36, 37, 38 and 39, which may have a designation of F/I/C/I/F, where the F and C are same as for the version 26 of the multilayer element 22 indicated herein. The I may stand for an insulator layer which may be, for example, $SiO_2$ or $Si_3N_4$. Layers 35 and 39 may be sufficiently wider than layers 36-38 to form a closed loop for magnetic flux around layers 36-38. A more complicated structure might possibly be used for element 22 of the present sensor 20; however, a structure having more than five layers might be too complex to be practical.

Version 26 of element 22, as shown in FIG. 4a, may be looked to for an example of dimensions. The dimensions may be any magnitude since the dimensions stated herein are merely illustrative instances. In general, the design approach is to miniaturize sensor 20 while keeping the GMI ratio. A length of version 26 of element 22 may be about 18 mm for layers 32, 33 and 34. The length may be of other magnitudes. FIGS. 4b and 4c are diagrams of cross-section views of version 26 of element 22. Layer 33 may be narrower than layers 32 and 34. The reason for this difference of width dimensions is that soft-magnetic layer 32 and 34 should be wider than the conductive layer 33 so that the soft-magnetic layers 32 and 34 can form a closed loop for magnetic flux 47 around the conductive layer 33, as shown in FIG. 4b. The direction of the flux may be either way depending on the particular design. Similarly, the soft magnetic material layers can form a closed loop for magnetic flux in version 27 of element 22 shown in FIG. 5. The shapes of the layers 32, 33 and 34 and their arrangement may have various forms such as like the illustrative examples shown in FIGS. 4b and 4c. Another version of element 22 may have soft magnetic material formed around a non-magnetic conductor along most or all of the length of the non-magnetic conductor. The layers or materials of the element need not necessarily be flat but may be circular or any other shape. The shapes of the layers and respective arrangements of the layers of element 22 may be other kinds not necessarily described herein. The diagrams in FIGS. 4a, 4b, 4c and 5 are not necessarily drawn to scale.

The dimensions of version 26, and any other version of element 22, may vary depending on the GMI materials and design. However, with the illustrative example of version 26, layers 32 and 34 may be FeSiB and layer 33 may be Cu. The composition of the layers may have various other materials. A width dimension 41 of each of the layers 32 and 34 may be about 0.8 mm. The thickness dimensions 45 and 46 may each be about two microns. The width dimension 42 of layer 33 may be about 0.4 mm. The thickness dimension 44 of layer 33 may be about one micron. The lengths of layers 32, 33 and 34 may be about the same and for version 26 could be about 18 mm or so. In some instances, the middle layer 33 might be longer than the outer layers 32 and 34 of element 22 for connection purposes. The layers of versions 25 and 27 may have similar or different dimensions for the various layers 32 and 34 of element 22. But the basic designs and configurations may be the same. The dimensions may be design specific.

The connections 24 to sensor 20 and connections 23 between the elements 22 may include Al or Cu. Or the material of the connections 24 for sensor 20 may be the same as that of the electrode material of an associated ASIC. It is also possible to use the same material of the C portion in the multilayer element 22 for connections 24 and/or 23.

In the present specification, some of the matter may be of a hypothetical or prophetic nature although stated in another manner or tense.

Although the invention has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. A magnetic sensor comprising:
   a substrate;
   two or more magnetic field sensitive elements positioned on the substrate along a length thereof; and
   at least one connector for connecting the two or more elements in series;
   wherein the elements are elongated, along-side each other and approximately parallel to each other; and
   wherein:
   an element comprises:
      a non-magnetic conductor; and
      at least one soft magnetic material layer situated on the non-magnetic conductor; and
      at least one soft magnetic material layer is for providing a path for magnetic flux around the non-magnetic conductor.

2. The sensor of claim 1, wherein the elements comprise giant magneto-impedance material.

3. The sensor of claim 1, wherein the elements comprise a soft magnetic material.

4. The sensor of claim 3, wherein:
   the elements are relatively straight thin film strips; and
   the elements have a length to width ratio of about equal to or greater than two.

5. The sensor of claim 1, wherein:
the elements comprise giant magneto-impedance material;
the elements are relatively straight.

6. A magnetic field sensor comprising:
a substrate having a length and a width;
a plurality of impedance elements disposed on the substrate; and
a plurality of connectors for connecting the elements in series; and
wherein:
the elements are approximately parallel to one another and spaced a distance from one another along the length of the substrate;
the elements are relatively straight giant magneto-impedance elements; and
an element comprises:
- a first soft magnetic layer;
- a non-magnetic and conductive layer adjacent to the first soft magnetic layer; and
- a soft magnetic layer adjacent to the non-magnetic and conductive layer; and
wherein the first soft magnetic layer and the second soft magnetic layer have a width sufficiently larger than the non-magnetic and conductive layer so as to be in contact with each other to result in a closed loop for magnetic flux around the non-magnetic and conductive layer.

7. A magnetic field sensor comprising:
a substrate having a length and a width;
a plurality of impedance elements disposed on the substrate; and
a plurality of connectors for connecting the elements in series; and
wherein:
the elements are approximately parallel to one another and spaced a distance from one another along the length of the substrate;
the elements are relatively straight giant magneto-impedance elements; and
an element comprises:
- a first soft magnetic layer;
- a first insulator adjacent to the first soft magnetic layer;
- a non-magnetic and conductive layer adjacent to the first insulator layer;
- a second insulator layer adjacent to the non-magnetic and conductive layer; and
- a second soft magnetic layer adjacent to the second insulator layer.

8. A method for making a magnetic field sensor comprising:
forming a plurality of strips on a substrate along a length of the substrate; and
connecting the strips in series with electrodes; and
wherein:
the strips are magneto-impedance elements; and
the strips are situated approximately parallel and proximate to one another
a strip of the plurality of strips comprises:
- a soft magnetic layer;
- a non-magnetic and conductive layer on the soft magnetic layer; and
- a soft magnetic layer on the non-magnetic and conductive layer; and
wherein the first and the second soft magnetic layers are in contact with each other.

9. The sensor of claim 7, wherein the first soft magnetic layer and the second soft magnetic layer have a width sufficiently larger than the first and second insulator layers and the non-magnetic and conductive layer, so as to be in contact with each other to result in a closed loop for magnetic flux around the first and second insulator layers and the non-magnetic and conductive layer.

* * * * *